(12) United States Patent
Bischopink et al.

(10) Patent No.: US 9,780,284 B2
(45) Date of Patent: Oct. 3, 2017

(54) MICROMECHANICAL SENSOR DEVICE AND CORRESPONDING PRODUCTION METHOD

(71) Applicant: Robert Bosch GmbH, Stuttgart (DE)

(72) Inventors: Georg Bischopink, Pliezhausen (DE); Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 51 days.

(21) Appl. No.: 14/778,593

(22) PCT Filed: Mar. 13, 2014

(86) PCT No.: PCT/EP2014/054938
§ 371 (c)(1),
(2) Date: Sep. 20, 2015

(87) PCT Pub. No.: WO2014/146965
PCT Pub. Date: Sep. 25, 2014

(65) Prior Publication Data
US 2016/0056365 A1    Feb. 25, 2016

(30) Foreign Application Priority Data

Mar. 19, 2013  (DE) .......................... 10 2013 204 763

(51) Int. Cl.
*H01L 21/768*   (2006.01)
*H01L 37/02*    (2006.01)
(Continued)

(52) U.S. Cl.
CPC .............. *H01L 37/02* (2013.01); *G01J 5/024* (2013.01); *G01J 5/0225* (2013.01); *G01J 5/045* (2013.01);
(Continued)

(58) Field of Classification Search
CPC ..................................................... H01L 21/768
See application file for complete search history.

(56) References Cited

U.S. PATENT DOCUMENTS 5,424,544 A   6/1995  Shelton et al.
5,478,242 A  12/1995  Walker et al.
(Continued)

FOREIGN PATENT DOCUMENTS

DE         100 58 864 A1   6/2002
DE   10 2009 017 845 A1  10/2010
(Continued)

OTHER PUBLICATIONS

International Search Report corresponding to PCT Application No. PCT/EP2014/054938 mailed Sep. 2, 2014 (German and English language document) (9 pages).

*Primary Examiner* — Kenneth Parker
*Assistant Examiner* — Christopher Culbert
(74) *Attorney, Agent, or Firm* — Maginot, Moore & Beck LLP

(57) ABSTRACT

A micromechanical sensor device and a corresponding production method include a substrate that has a front and a rear and a plurality of pillars that are formed on the front of the substrate. On each pillar, a respective sensor element is formed, which has a greater lateral extent than the associated pillar. A cavity is provided laterally to the pillars beneath the sensor elements. The sensor elements are laterally spaced apart from each other by respective separating troughs and make electrical contact with a respective associated rear contact via the respective associated pillar.

6 Claims, 8 Drawing Sheets

(51) Int. Cl.
*G01J 5/04* (2006.01)
*G01J 5/02* (2006.01)
*G01J 5/34* (2006.01)
*G01J 5/08* (2006.01)
*H01L 31/0224* (2006.01)
*H01L 31/09* (2006.01)
*H01L 31/18* (2006.01)

(52) U.S. Cl.
CPC ............... *G01J 5/0853* (2013.01); *G01J 5/34* (2013.01); *H01L 31/0224* (2013.01); *H01L 31/09* (2013.01); *H01L 31/18* (2013.01); *G01J 2005/345* (2013.01)

(56) References Cited

U.S. PATENT DOCUMENTS

| | | | |
|---|---|---|---|
| 5,565,682 | A | 10/1996 | Frank et al. |
| 6,239,433 | B1 | 5/2001 | Porter |
| 2004/0256559 | A1 | 12/2004 | Ryu et al. |
| 2007/0019280 | A1* | 1/2007 | Sasagawa ............... B81B 3/007 359/315 |

FOREIGN PATENT DOCUMENTS

| | | |
|---|---|---|
| EP | 0 298 568 A2 | 1/1989 |
| EP | 0 608 067 A1 | 7/1994 |
| EP | 0 853 237 A1 | 7/1998 |
| WO | 2008/145353 A1 | 12/2008 |
| WO | 2010/119131 A1 | 10/2010 |

* cited by examiner

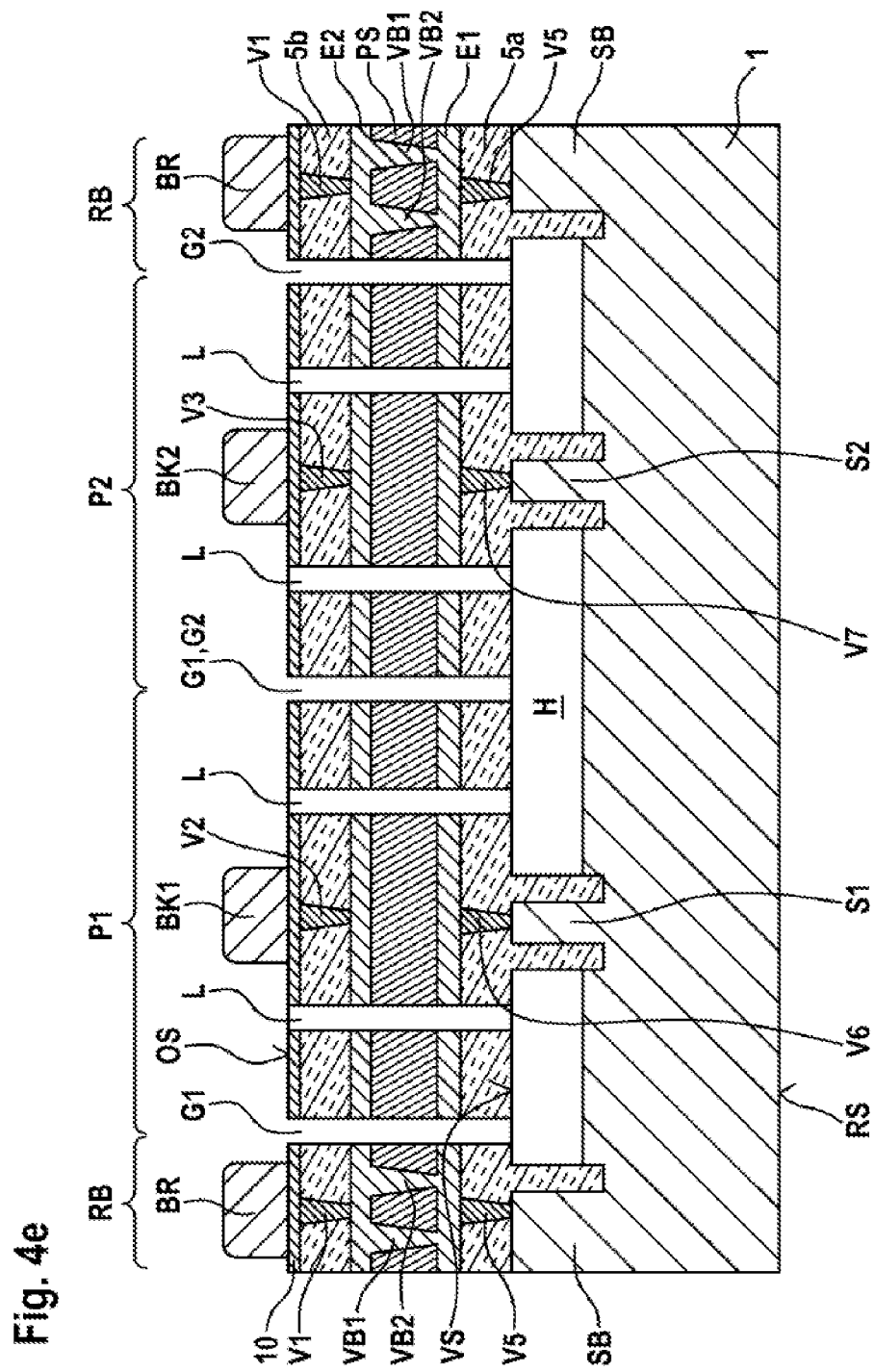

MICROMECHANICAL SENSOR DEVICE AND CORRESPONDING PRODUCTION METHOD

This application is a 35 U.S.C. § 371 National Stage Application of PCT/EP2014/054938, filed on Mar. 13, 2014, which claims the benefit of priority to Serial No. DE 10 2013 204 763.0, filed on Mar. 19, 2013 in Germany, the disclosures of which are incorporated herein by reference in their entirety.

BACKGROUND

The disclosure relates to a micromechanical sensor device and to a corresponding production method.

Although also applicable to arbitrary micromechanical components, the present disclosure and the problem addressed by it will be explained with reference to silicon-based pyroelectric infrared sensors.

Pyroelectric infrared sensors are known from U.S. Pat. Nos. 5,424,544 A, 6,239,433 B1 and WO 2010/119131 A1. The examples described therein are subject to complex cost-intensive production processes. The pixel architectures disclosed lead as a result of their common electrode layer to thermal crosstalk of the pixel elements among one another. In some instances, the known components require expensive, vacuum-tight packaging.

SUMMARY

The disclosure provides a micromechanical sensor device and a corresponding production method.

The respective dependent claims relate to preferred developments.

The concept underlying the present disclosure consists in providing a micromechanical sensor device comprising sensor elements which are mechanically anchored and electronically contacted via substrate supports and extend laterally over a cavity.

The present disclosure thus provides a cost-effective integrated micromechanical sensor device and a corresponding production method with the possibility of chip scale packaging, wherein one preferred use is a thin-film pyrometer camera or a thin-film pyrometer motion sensor.

This production method according to the disclosure enables high filling factors of the sensor elements. The structural size can be reduced by the chip scale packaging and mechanical and/or thermal and/or electrical crosstalk of the sensor elements among one another can be significantly reduced or completely eliminated by the isolating trenches and the cavity.

The isolating trenches likewise serve for the sacrificial layer etching of the substrate, but can be supplemented by additional sacrificial layer etching holes. The rear contact provides for an electrical linking of all the sensor elements and simultaneously serves as support of the pixel during the bonding process. In this case, it is expedient that the front-side contact and the rear-side contact of the respective sensor element overlap as completely as possible. The rear-side contact is expediently protected against the sacrificial layer etching medium, e.g. an etching gas, circumferentially with an etch stop layer, e.g. composed of $SiO_2$.

In accordance with one preferred development, the sensor elements have a respective front-side contact, wherein the front-side contacts lie on an opposite side relative to the rear side, i.e. on a side of the sensor element that faces away from the substrate. This enables a space-saving electrical linking.

In accordance with a further preferred development, the substrate has an edge region with a ring contact which is led via a corresponding edge wall to the side opposite the rear side and is laterally spaced apart from the sensor elements by the respective isolating trenches. In this regard, the substrate can be electrically linked over a large area and provide a hermetically impermeable capping.

In accordance with a further preferred development, the sensor elements are infrared-sensitive and have a pyroelectric layer embedded between a first and second electrode layer. In this regard, a highly integrated infrared camera can be formed.

In accordance with a further preferred development, the sensor elements have a first electrically insulating absorber layer on the first electrode layer and a second electrically insulating absorber layer on the second electrode layer. This provides good light absorption.

In accordance with a further preferred development, the columns (S1, S2) are surrounded by an etch stop layer, which preferably corresponds to the first electrically insulating absorber layer. This enables a multiple function of the relevant layer and contributes to a readily controllable etching process.

In accordance with a further preferred development, an evaluation unit is bonded on the side opposite the rear side, said evaluation unit contacting the ring contact and the front-side contacts. In this regard, the evaluation unit can be connected in a space-saving manner.

In accordance with a further preferred development, the evaluation unit is bonded in such a way that it closes the cavity. In this regard, a controlled atmosphere can form in the cavity, e.g. a vacuum.

In accordance with a further preferred development, the sensor elements have etching holes. In this regard, the sacrificial layer etching process can be accelerated and controlled well.

BRIEF DESCRIPTION OF THE DRAWINGS

Further features and advantages of the present disclosure are explained below on the basis of embodiments with reference to the figures.

In the figures.

DETAILED DESCRIPTION

In the figures, identical reference signs designate identical or functionally identical elements.

Figure 1:
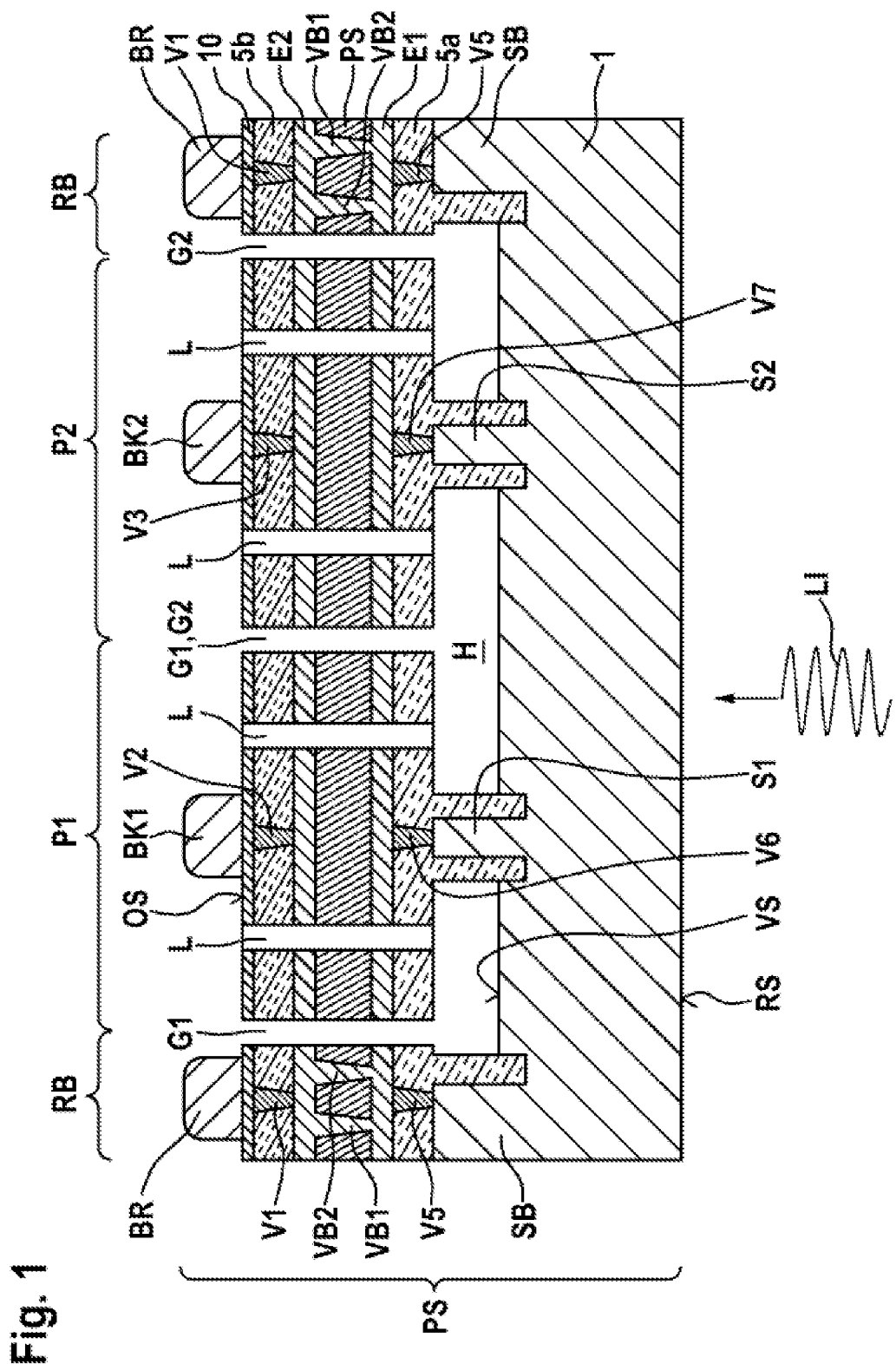
FIG. 1 shows a schematic cross-sectional view for elucidating a micromechanical sensor device in accordance with a first embodiment of the present disclosure.

FIG. 1 is a schematic cross-sectional view for elucidating a micromechanical sensor device in accordance with a first embodiment of the present disclosure.

In FIG. 1, reference sign 1 designates a low-resistance silicon substrate having a front side VS and a rear side RS. A first column S1 and a second column S2 are formed on the front side VS of the silicon substrate 1. A circumferential edge wall SB is formed in an edge region RB of the silicon substrate 1.

A respective sensor element P1 and P2 in the form of a pyroelectric pixel element is formed on the first column S1 and the second column S2, wherein the sensor elements P1, P2 in each case have a larger lateral extent than the associated column S1 and S2, respectively, and wherein a cavity H is provided laterally with respect to the columns S1 and S2 below the sensor elements P1 and P2, respectively.

The sensor elements P1, P2 are laterally spaced apart from one another by respective isolating trenches G1, G2 and are electrically contacted via the respectively associated column S1 and S2 at their respective rear side via the columns S1, S2 and contact plugs V6, V7.

The sensor elements P1, P2 have a lower electrically insulating layer 5a composed of silicon oxide, which also simultaneously envelops the columns S1, S2 completely in an insulating manner. Through the layer 5a, in the case of the first sensor element P1, a contact plug V6 is led from a first electrode layer E1 to the top side of the support S1. Situated on the first electrode layer E1 is a pyroelectric layer PS and thereon a second electrode layer E2. Situated on the second electrode layer E2 is a second electrically insulating layer 5b composed of silicon oxide, through which is led a contact plug V2 which connects the second electrode layer E2 to a metal layer 10, for example composed of TiW.

The pyroelectric layer PS is, for example, a c-axis-oriented PZT (lead zirconium titanate) or BST (barium strontium titanate). The electrode layers E1, E2, for example, are LNO (lithium niobate) or SRO (strontium ruthenium oxide).

Bond contacts BK1, BK2 and BR consisting of Cu or Cu/Sn, for example, are provided on the metal layer 10. Continuous etching holes L are additionally provided in the first sensor element P1, said etching holes being of importance for the production process described further below.

The second sensor element P2 is constructed analogously like the first sensor element P1, wherein the contact plug that is electrically connected to the column S2 and the first electrode layer E1 is designated by reference sign V7, and wherein the contact plug that is electrically connected to the second electrode layer E2 and the metal layer 10 is designated by reference sign V3. The bond contact of the second sensor element P2 that is provided on the metal layer 10 bears reference sign BK2.

The first electrically insulating layer 5a is likewise situated on the edge wall SB, through which first electrically insulating layer is led a contact plug V5 which provides an electrical connection of the substrate 1 to the first electrode layer E1 in this region. In the edge region RB the pyroelectric layer PS is pervaded by two further contact plugs VB1, VB2 composed of the material of the second electrode layer E2, which short-circuit the first electrode layer E1 with the second electrode layer E2, that is to say electrically bridge the pyroelectric layer PS.

Situated on the second electrode layer E2 in the edge region RB there is likewise the second electrically insulating layer 5b, pervaded by a contact plug V1, which produces a connection to the metal layer 10 situated there. Reference sign BR denotes a bond frame contact, which is embodied circumferentially like the edge wall SB and the layers situated thereon.

All the bond contacts BK1, BK2 and the bond frame contact BR thus lie jointly on the opposite side OS of the sensor device relative to the rear side RS and have the same level owing to an identical layer substructure.

The function of the micromechanical sensor device constructed in this way, which is also designated as a pixel substrate PS, consists in the fact that light LI is incident from the rear side RS on the arrangement of the sensor elements P1, P2, is absorbed there in the layers 5a, 5b composed of silicon oxide and initiates the temperature change resulting therefrom, which is electrically detectable as a voltage difference via the bond contacts BK1, BK2 and the bond frame contact BR.

Pyroelectric crystals of the pyroelectric layer PS are ionic crystals having permanent electrical polarization. If these pyroelectric crystals are heated or cooled down, then opposite surfaces are oppositely electrically charged. The resulting voltage difference can be tapped off at the corresponding crystal edges (surfaces) with the electrode layers E1, E2. In this case, the polarization is proportional to the temperature change. However, the surface charges present are compensated for by charge carriers taken up from the surroundings, e.g. free electrons. Therefore, surface charges occur only when there is a change in the temperature of a pixel. On account of these properties, movements can be detected very well with such a pyroelectric camera using pyroelectric pixel elements with permanent light incidence, since only pixels in which the infrared radiation changes become visible. For still images, by contrast, the light incidence has to be modulated by use of a chopper.

The pyrometric pixel element can be provided with absorber layers for the radiation respectively of interest, for example—in the case of the present embodiment—with the layers 5a, 5b composed of $SiO_2$ for the far infrared of 8-12 μm.

Consequently, the SiO2 layer can perform a double function as etch stop layer for the supports and absorption layer for the sensor elements, as explained in greater detail further below.

The cavity H and the isolating trenches G1, G2 provide for good thermal insulation of the sensor elements P1, P2 among one another. The front-side and rear-side contacts of the sensor elements P1, P2 thus jointly determine the heat dissipation from the respective sensor element P1, P2. A small cross section leads to a larger signal swing and a larger cross section leads to a faster time constant of the pixel. The exact dimensioning for this is dependent on the specific desired functional properties.

The substrate 1 additionally protects the sensor elements against contamination. The metal layer 10, e.g. composed of TiW, serves as a diffusion barrier during bonding and also simultaneously as a reflector layer or electroplating start layer.

Figure 2:
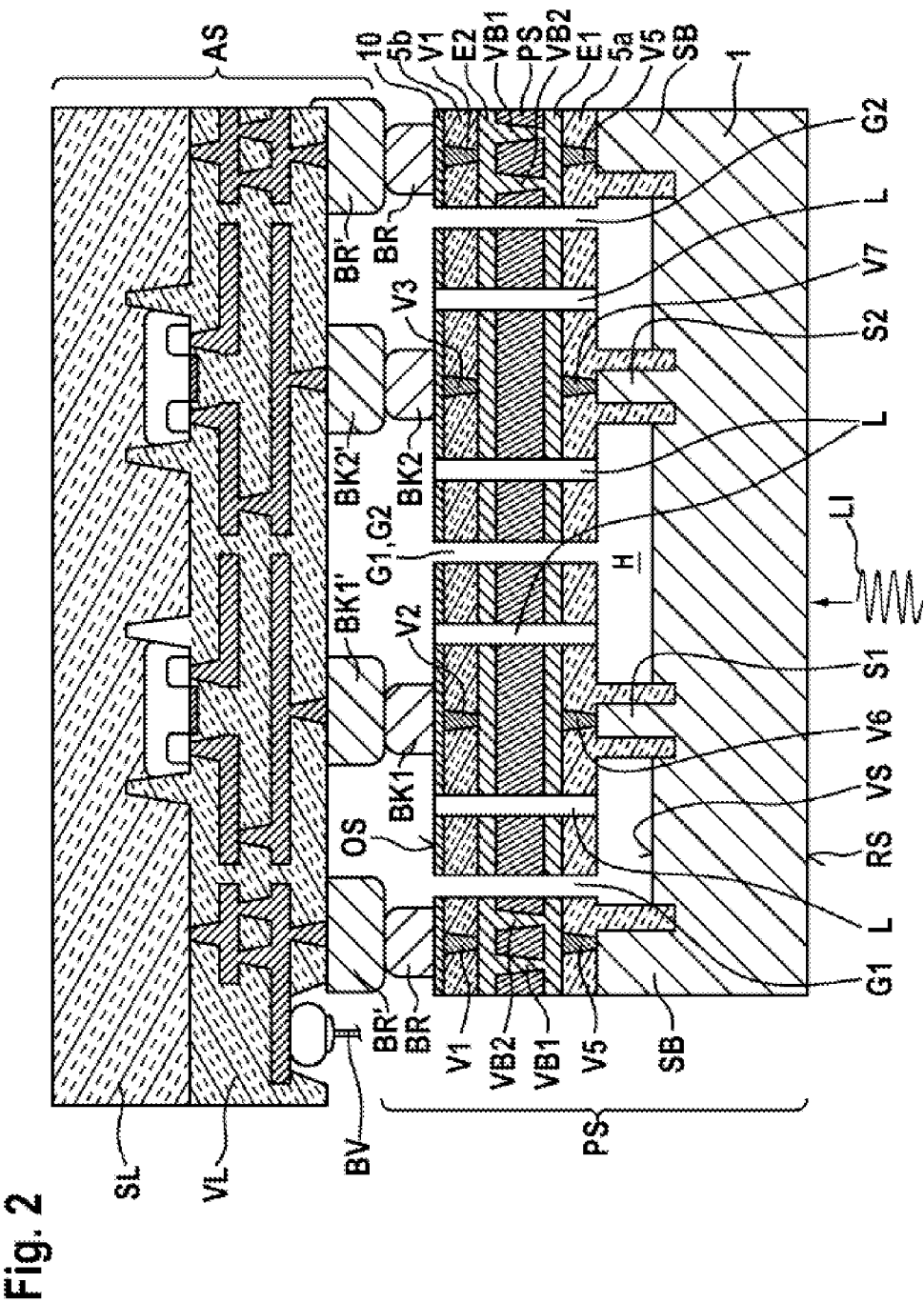
FIG. 2 shows a schematic cross-sectional view for elucidating a micromechanical sensor device with an exemplary connected evaluation unit in accordance with a second embodiment of the present disclosure.

FIG. 2 is a schematic cross-sectional view for elucidating a micromechanical sensor device with an exemplary connected evaluation unit in accordance with a second embodiment of the present disclosure.

In accordance with FIG. 2, an evaluation unit AS in the form of an evaluation substrate having a circuit region SL and a wiring region VL is bonded onto the pixel substrate PS from FIG. 1. The evaluation substrate AS has an analogous bond frame contact BR' for connection to the bond frame contact BR and analogous bond contacts BK1', BK2' for connection to the bond contacts BK1, BK2 of the pixel substrate PS. The corresponding contacts are bonded to one another in such a way that the circuit substrate AS closes the cavity H, wherein either vacuum or a predetermined gas atmosphere can be provided in the cavity.

The circuit substrate AS also has a bond connection BV at its side facing the pixel substrate PS, which is designated by reference sign BV and is electrically connected to the circuit region SL via the wiring region VL.

The bond connection is preferably produced by means of thermocompression bonding or SLID (solid-liquid interdiffusion) bonding.

It is advantageous for bonding if the bond frame contacts BR, BR' and the bond contacts BK1, BK2 and BK1', BK2' have different sizes. If the size differences here take account of the alignment tolerances of the planes with respect to one another, the bonding process becomes tolerant toward offset and undesirable tilting of the sensor elements does not occur.

Both in the case of the first embodiment and in the case of the second embodiment the bond frame contact BR' and the bond contacts BK1', BK2' of the evaluation substrate AS have a larger lateral extent than the bond frame contact BR and the bond contacts BK1, BK2 of the pixel substrate PS.

Figure 3:
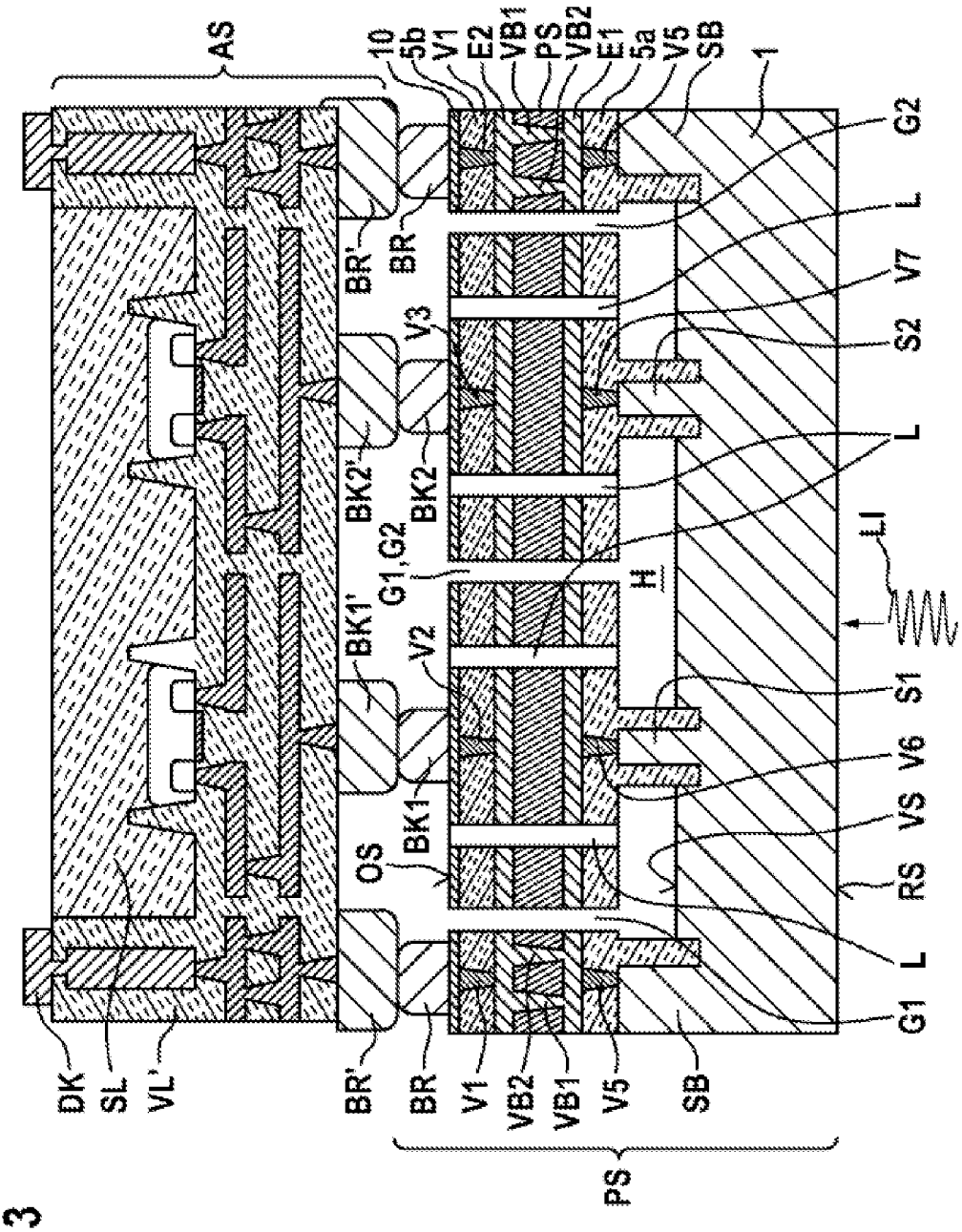
FIG. 3 shows a schematic cross-sectional view for elucidating a micromechanical sensor device with a further exemplary connected evaluation unit in accordance with a third embodiment of the present disclosure.

FIG. 3 is a schematic cross-sectional view for elucidating a micromechanical sensor device with a further exemplary connected evaluation unit in accordance with a third embodiment of the present disclosure.

In the case of the embodiment in accordance with FIG. 3, a modified evaluation unit AS' in the form of an evaluation substrate AS' is bonded onto the pixel substrate PS of the first embodiment in accordance with FIG. 1.

This likewise takes place via corresponding bond frame contacts BR, BR' and bond contacts BK1, BK2 and BK1', BK2'. In the case of this embodiment the wiring region bears reference sign VL' and has a plated-through hole DK as the difference with respect to the wiring region VL of the second embodiment, such that the circuit region SL is contactable from the opposite side of the evaluation substrate AS' relative to the pixel substrate PS.

Figure 4A:
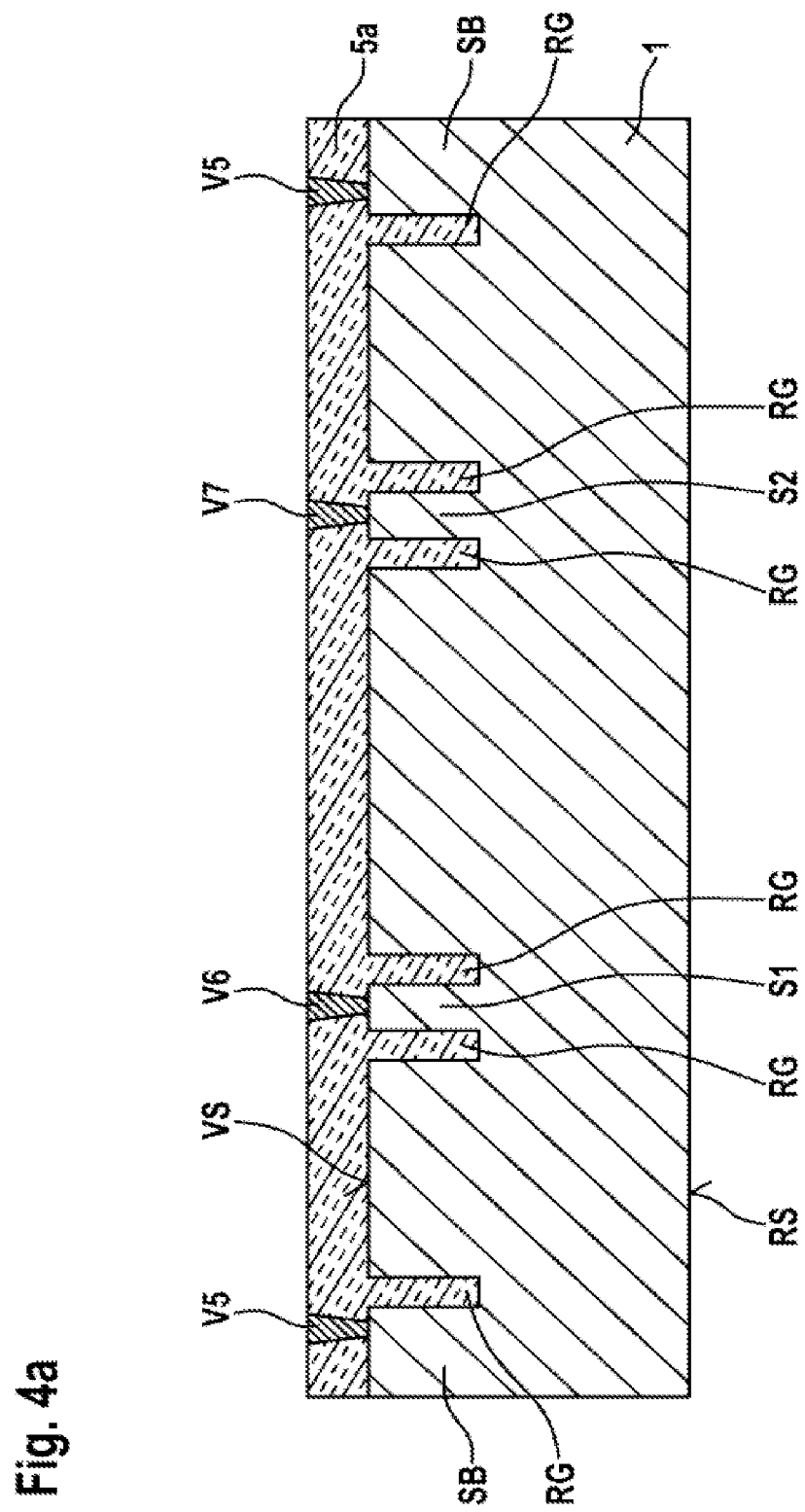
FIGS. 4a)-e) show schematic cross-sectional views for elucidating a production method for the micromechanical sensor device in accordance with the first embodiment of the present disclosure.

FIGS. 4a)-e) are schematic cross-sectional views for elucidating a production method for the micromechanical sensor device in accordance with the first embodiment of the present disclosure.

As illustrated in FIG. 4a), firstly the low-resistance silicon substrate 1 is provided and the columns S1, S2 and the edge wall SB are formed by the etching of ring trenches RG in the substrate 1, wherein the ring trenches RG surround the respective columns S1, S2 or adjoin the edge wall SB.

In a further process step, the ring trenches RG are filled with the first electrically insulating layer 5a composed of silicon oxide, wherein the first electrically insulating layer 5a additionally covers the front side VS of the substrate 1 with a specific height.

A subsequent process step involves forming the contact plugs V6, V7 which electrically contact the first and second columns S1 or S2 through the first electrically insulating layer 5a. Furthermore, the contact plug V5 is formed, this contact plug electrically contacting the edge wall SB through the first electrically insulating layer 5a. This first electrically insulating layer 5a, as explained in greater detail in the further course of the process, has a triple function, namely an insulation function, an etch stop function and an absorber function. Optionally, the top side of the first electrically insulating layer 5a with the contact plugs V5, V6, V7 situated therein is also planarized by means of a CMP step.

Figure 4B:
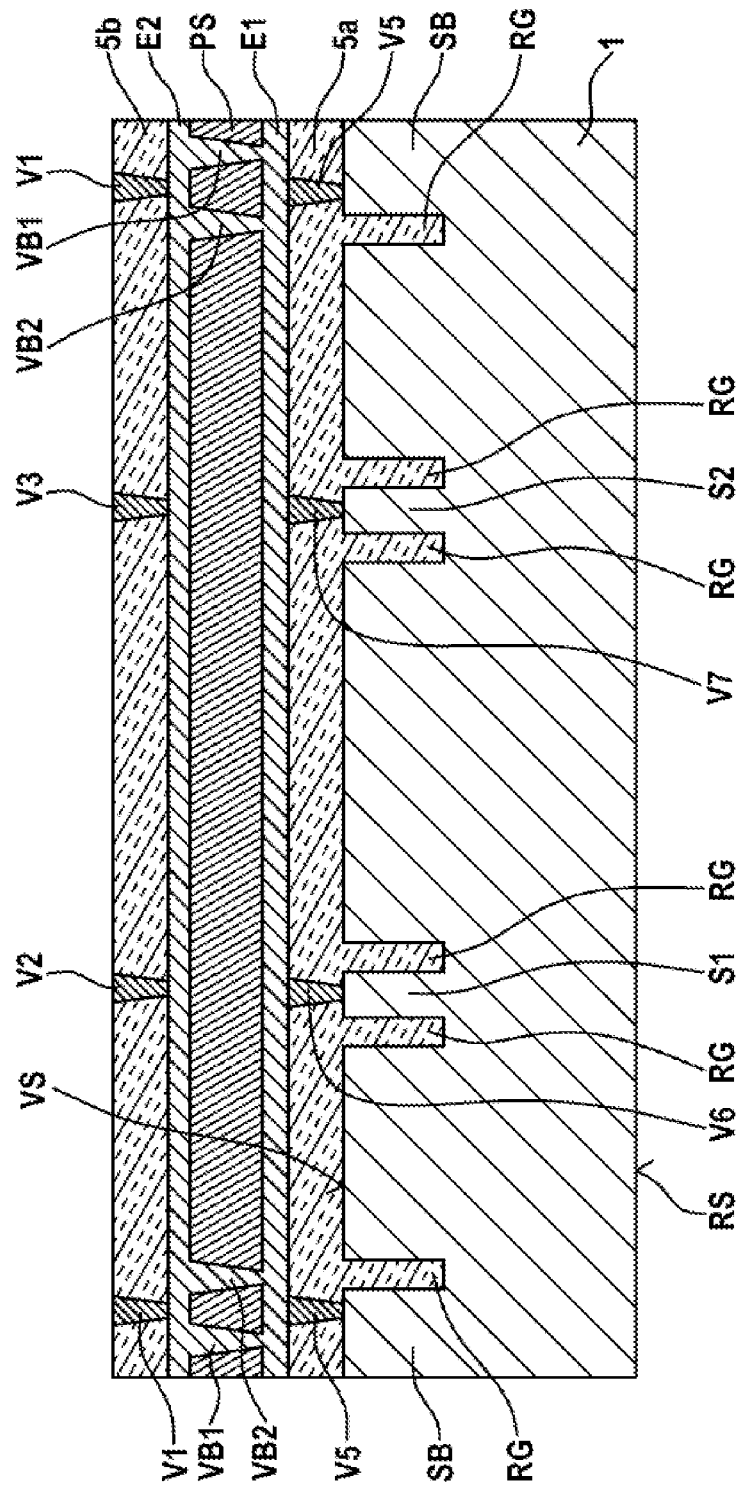

Furthermore, with reference to FIG. 4b), the first electrode layer E1 is deposited above the structure in accordance with FIG. 4a), and the pyroelectric layer PS is in turn deposited above said first electrode layer. Afterward, holes for the contact plugs VB1, VB2 are formed in the pyroelectric layer PS in the edge region. Afterward, the second electrode layer E2 is deposited on the pyroelectric layer PS, wherein the contact plugs VB1, VB2 for the circumferential edge contact form in said holes in the process.

Afterward, the second electrically insulating layer 5b is deposited on the second electrode layer E2 and the contact plugs V1, V2 and V3 are formed in said electrically insulating layer. After this process step, too, an optional planarization step in the form of a CMP step can be carried out.

Figure 4C:
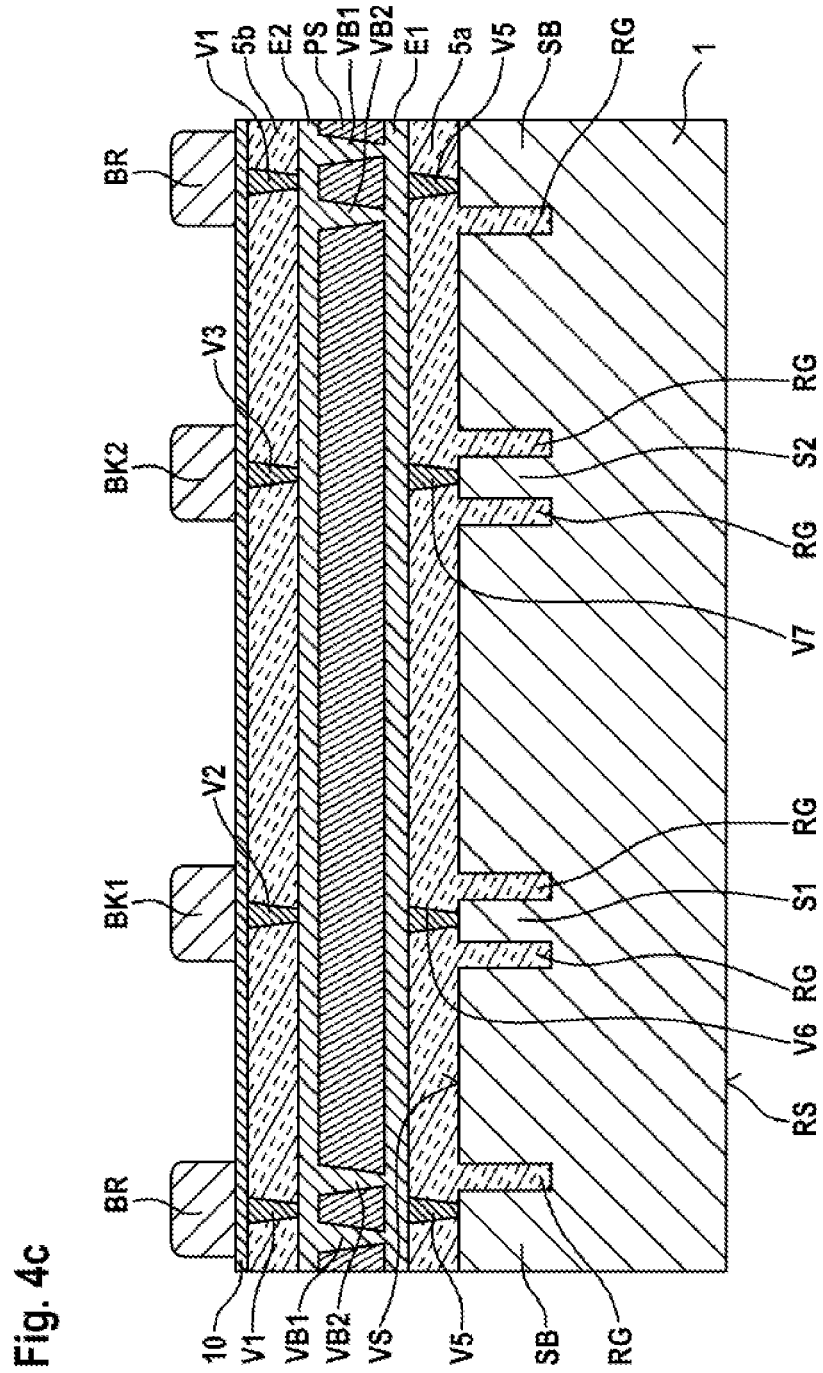

Furthermore with reference to FIG. 4c), the metal layer 10 composed of TiW, for example, is deposited, which metal layer forms an electroplating start layer, diffusion barrier and a reflector layer for the IR radiation LI to be detected.

In a subsequent process step, the bond frame contact BR and the bond contacts BK1, BK2 of the first and second sensor elements P1, P2, respectively, are formed on the metal layer 10. This formation of the bond frame contact BR and the bond contacts BK1, BK2 is preferably carried out by means of electroplating using a resist mask that covers the regions of the metal layer 10 that are not to be reinforced thereby.

Figure 4D:
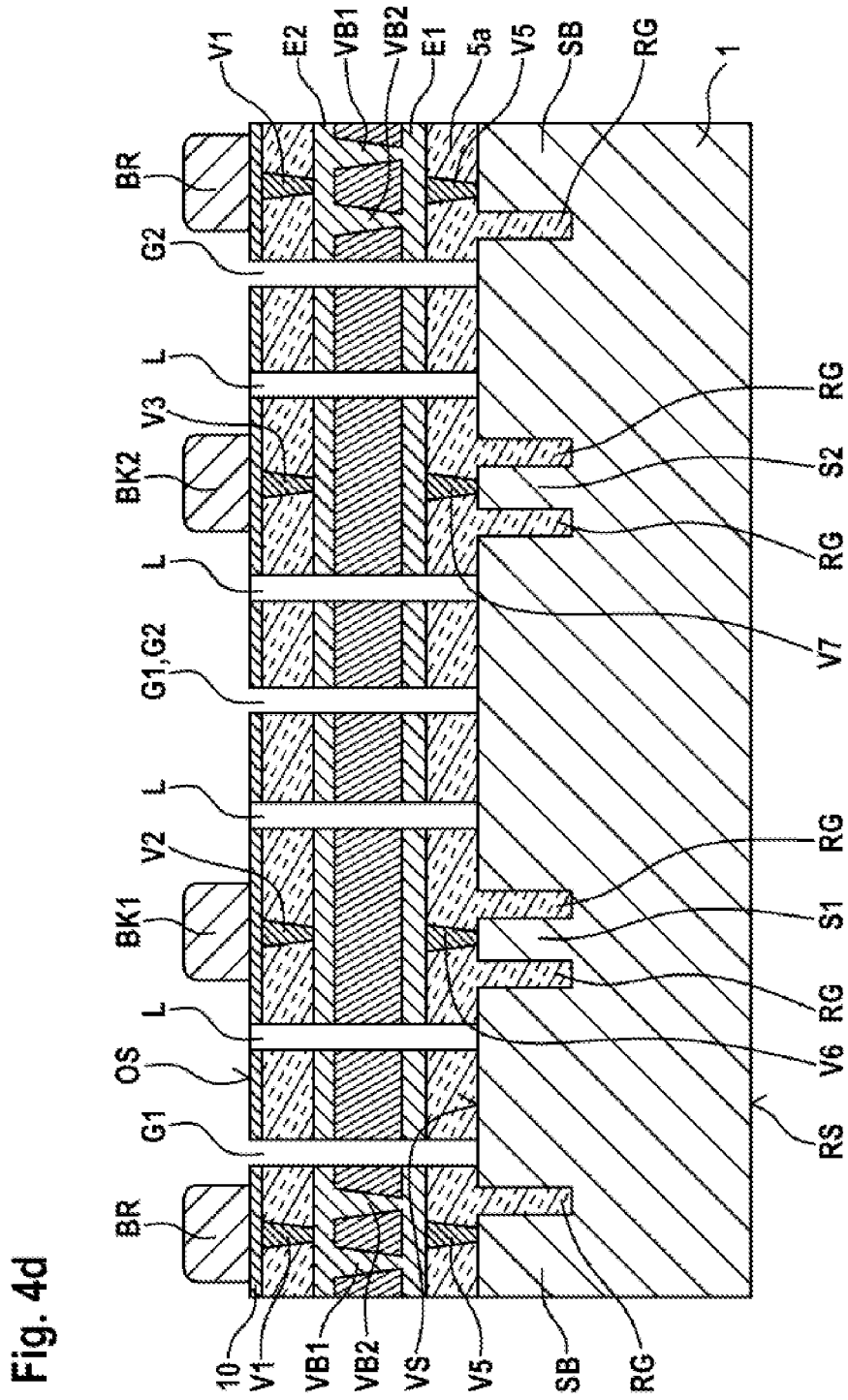

As illustrated in FIG. 4d), the isolating trenches G1, G2 are then formed, which laterally isolate the sensor elements P1, P2 and the edge region BR from one another. This is expediently carried out by means of an etching process that stops on the front side VS of the silicon substrate 1. In addition, etching trenches L can optionally be formed in the sensor elements P1, P2, said etching trenches likewise extending as far as the front side VS of the silicon substrate 1.

The process state shown in FIG. 4d) is followed by sacrificial layer etching of the part exposed by the isolating trenches G1, G2 and the etching trenches L at the front side VS of the silicon substrate 1 by means of a gaseous etching medium, such that the cavity H is formed laterally with respect to the columns S1, S2 and below the sensor elements P1, P2, wherein the first electrically insulating layer 5a acts as an etch stop layer around the columns S1, S2 and at the edge wall SB.

The process state in accordance with FIG. 1 is thus reached in accordance with FIG. 4e).

The production of the connection to the evaluation substrate AS and AS' in accordance with the second and third embodiments, respectively, is then preferably carried out by means of a known thermocompression bonding step or SLID bonding step.

Although the present disclosure has been described on the basis of preferred exemplary embodiments, it is not restricted thereto. In particular, the materials and topologies mentioned are merely by way of example and not restricted to the examples explained.

The invention claimed is:
1. A method for producing a micromechanical sensor device, comprising:
 forming a plurality of columns on a substrate having a front side and a rear side, the plurality of columns being formed on the front side of the substrate by etching ring trenches surrounding the columns;
 filling the ring trenches with a first electrically insulating layer in such a way that the first electrically insulating layer covers the front side;
 forming first contact plugs that in each case electrically contact a column through the first electrically insulating layer;
 applying a sensor layer sequence that electrically contacts the contact plugs;

depositing a second electrically insulating layer on the sensor layer sequence;

forming second contact plugs that in each case electrically contact the sensor layer through the second electrically insulating layer above corresponding first contact plugs;

forming isolating trenches that extend as far as the front side and whereby the sensor layer is divided into sensor elements that are laterally spaced apart from one another by the isolating trenches; and etching back the front side through the isolating trenches such that a cavity is formed laterally with respect to the columns below the sensor elements, wherein the first electrically isolating layer acts as an etch stop layer around the columns.

2. The method as claimed in claim 1, wherein applying the sensor layer sequence comprises:

depositing a first electrode layer that electrically contacts the contact plugs;

depositing a pyroelectric layer on the first electrode layer; and depositing a second electrode layer on the pyroelectric layer.

3. The method as claimed in claim 1, wherein, before etching back the front side, additional etching holes are formed in the sensor layer, said etching holes extending as far as the front side.

4. The method as claimed in claim 1, wherein:

etching the ring trenches forms an edge wall in an edge region of the substrate, and a ring contact is formed in the edge region of the substrate, the ring contact being led on a side of the sensor elements that faces away from the substrate.

5. The method as claimed in claim 4, wherein an evaluation unit is bonded on the side of the sensor elements, said evaluation unit contacting the ring contact and sensor elements via the second contact plugs.

6. The method as claimed in claim 5, wherein the evaluation unit is bonded in such a way that the evaluation unit closes the cavity.

* * * * *